(12) United States Patent
Suzuki

(10) Patent No.: US 6,725,908 B2
(45) Date of Patent: Apr. 27, 2004

(54) COOLING APPARATUS BOILING AND CONDENSING REFRIGERANT WITH EFFECTIVE PERFORMANCE IN A TILTED POSITION

(75) Inventor: Kazutaka Suzuki, Kariya (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 10/357,140

(22) Filed: Feb. 3, 2003

(65) Prior Publication Data

US 2003/0150599 A1 Aug. 14, 2003

(30) Foreign Application Priority Data

Feb. 8, 2002 (JP) ........................................ 2002-032424

(51) Int. Cl.⁷ .............................................. F28D 15/00
(52) U.S. Cl. ............................ 165/104.21; 165/104.33; 361/700; 257/715
(58) Field of Search ..................... 165/104.33, 104.21, 165/104.26, 153, 166, 167, 173, 80.3, 185; 361/700; 257/714, 715; 174/16.3, 15.2

(56) References Cited

U.S. PATENT DOCUMENTS 6,341,645 B1 * 1/2002 Tanaka et al. ......... 165/104.33
6,397,935 B1 * 6/2002 Yamamoto et al. ..... 165/104.26

* cited by examiner

Primary Examiner—Christopher Atkinson
(74) Attorney, Agent, or Firm—Harness, Dickey & Pierce, PLC

(57) ABSTRACT

Among four plate 21 to 24 that make up a refrigerant container, an intermediate plate 22 in contact with a heat receiving plate 21 is so provided with semi-annular peripheral channels 221 that they surround a boiling area of a refrigerant and, at the same time, is provided with straight channels 222 extending from the peripheral channels 221 to the boiling area over substantially all around the circumference of the peripheral channels 221. According to this structure, even if the refrigerant container is used in a tilted position, a liquid refrigerant that has condensed completely is supplied to the boiling area through the straight channels 222 provided on the floor within the refrigerant container, after being stored in the lowest position of the refrigerant container through the peripheral channels 221 provided on the floor within the refrigerant container.

12 Claims, 8 Drawing Sheets

COOLING APPARATUS BOILING AND CONDENSING REFRIGERANT WITH EFFECTIVE PERFORMANCE IN A TILTED POSITION

BACKGROUND OF THE INVENTION

1. Field of the Invention

The present invention relates to a cooling apparatus boiling and condensing refrigerant that cools a heat-generating member by latent heat transfer while boiling and condensing a refrigerant.

2. Description of the Related Art

A cooling apparatus boiling and condensing refrigerant has been proposed in prior art. The cooling apparatus boiling and condensing refrigerant of the prior art comprises a refrigerant container that receives heat through its bottom that is in contact with a heat-generating member such as a heat-generating electronic part, plural tubes that communicate the inside of the refrigerant container and attached erectly to the upper surface of the refrigerant container, and a header tank through which the plural tubes are communicated with each other.

The refrigerant container comprises a heat receiving plate to the surface of which a heat-generating member is attached and a heat radiating plate to the surface of which the tubes are attached, and there are provided two stacked intermediate plates between the heat receiving plate and the heat radiating plate, each intermediate plate having plural slit-shaped openings that penetrate through the plate in the direction of thickness. Examples of intermediate plates used in a refrigerant container that have such multilayer structures are shown in FIG. 9A and FIG. 9B.

An intermediate plate 123 shown in FIG. 9A is contiguous to a heat radiating plate, to the surface of which tubes are attached, and is provided with plural slit-shaped openings 123*a* in parallel, which extend in the longitudinal direction in the drawing of the intermediate plate 123, as shown schematically. An intermediate plate 122 shown in FIG. 9B is contiguous to a heat receiving plate and provided with plural slit-shaped openings 122*a* in parallel, which extend in the transverse direction in the drawing of the intermediate plate 122, as shown schematically.

When the intermediate plates 122 and 123 are stacked on each other between the heat receiving plate and the heat radiating plate, the slit-shaped openings 122*a* and 123*a* are arranged so that they are perpendicular to each other. Due to this, all of the openings 122*a* and 123*a* are communicated with each other and a space to store a refrigerant in a refrigerant container is formed. The area inside the refrigerant container, on which the heat-generating member attaching area is projected from the bottom to the upper side, is referred to as a boiling area and it is shown as an area 161 surrounded by an alternating long and short dashed line in FIG. 9B.

When the cooling apparatus boiling and condensing refrigerant equipped with the refrigerant container cools a heat-generating member attached to the bottom outside of the refrigerant container, the refrigerant stored in the refrigerant container receives heat from the heat-generating member and boils mainly in the boiling area 161. The boiled and gasified refrigerant passes mainly through the tubes above the boiling area 161, through the header tank, and returns to the peripheral part within the refrigerant container mainly through the tubes above the area outside the boiling area 161. While moving, the refrigerant radiates latent heat to the outside and condenses into a liquid refrigerant, in the tubes.

However, in the above-mentioned cooling apparatus boiling and condensing refrigerant, when electronic equipment or the like, to which a heat-generating member such as a heat-generating electronic device to be cooled is mounted, is placed in a slightly tilted position, the surface of the heat-generating member in contact with the cooling apparatus boiling and condensing refrigerant is also tilted and the cooling apparatus boiling and condensing refrigerant is often used, as a result, in a state in which the bottom of the refrigerant container is tilted. In this case, the refrigerant is naturally stored in a space at a lower part within the refrigerant container.

When the heat-generating member generates heat and the boiling area 161 is mainly heated, the liquid refrigerant in this area receives heat and is evaporated into vapor, and the refrigerant that has circulated through the tubes and the header tank and condensed, as described above, returns to the lower part in the space within the refrigerant container. As the refrigerant in the boiling area is evaporated into vapor, the liquid refrigerant is moved and supplied from the lower part within the refrigerant container to the boiling area 161.

However, if the cooling apparatus boiling and condensing refrigerant is used in a tiled position, it is unlikely that the liquid refrigerant is smoothly moved and supplied from the lower part within the refrigerant container to the boiling area 161, and a problem occurs that the cooling performance may be deteriorated due to poor circulation of the refrigerant.

For example, when the refrigerant container is tilted so that the corner B of the intermediate plates 122 and 123, shown in FIGS. 9A and 9B, is the lowest part, the liquid refrigerant is stored near the lowest part 122*b* in the lowest opening 122*a* within the refrigerant container. The liquid refrigerant stored near the lowest part 122*b* in the opening 122*a* is supplied to the boiling area 161 through the opening 122*a* and the opening 123*a* without exception. As it is necessary for the liquid refrigerant at the lowest part 122*b* to move to another opening 122*a* through the opening 123*a* in the upper intermediate plate 123, which is located higher than the intermediate plate 122 by one step, the movement of the liquid refrigerant is often hampered, resulting in poor circulation of the refrigerant.

SUMMARY OF THE INVENTION

The above-mentioned problem being taken into account, the objective of the present invention is to provide a cooling apparatus boiling and condensing refrigerant that can prevent poor circulation of the refrigerant, even if used in a tilted position.

In order to achieve the above-mentioned object, a cooling apparatus boiling and condensing refrigerant (1) in a first aspect of the present invention comprises a refrigerant container (2) to the bottom outside of which a heat-generating member (6) is attached and within which a refrigerant that boils when it receives heat from the heat-generating member (6) is stored, a heat radiating section (3, 5) having plural tubes (3) communicating the inside of the refrigerant container (2) and assembled almost erectly on the surface of the refrigerant container (2), and a header tank (4) through which the plural tubes (3) are communicated with each other; wherein the heat-generating member (6) is cooled by the refrigerant stored in the refrigerant container (2), which is evaporated into vapor when receiving heat from the heat-generating member (6) and radiates the latent heat of the refrigerant vapor from the heat radiating section (3, 5); wherein a boiling area (61) where the refrigerant is evaporated into vapor by the heat-generating member (6) is formed within the refrigerant container (2); and wherein on the floor within the refrigerant container (2), one or plural substantially annular refrigerant channels (221) surrounding the boiling area (61) and plural substantially straight refrigerant channels (222) extending from the substantially annular refrigerant channels (221) to the boiling area (61), over substantially all around the circumference of the substantially annular refrigerant channels (221), are formed in the same plane.

According to the first aspect, even if the cooling apparatus boiling and condensing refrigerant (1) is used in a tilted position, the liquid refrigerant that has condensed completely is supplied to the boiling area (61) through the substantially straight refrigerant channels (222) on the floor within the refrigerant container (2), after being stored at the lowest part through the substantially annular refrigerant channel (221) on the floor within the refrigerant container (2). Therefore, it is unlikely that the movement of the liquid refrigerant is hampered, and it is possible to prevent poor circulation of the refrigerant.

Moreover, in a second aspect of the present invention it is possible to replace the substantially annular refrigerant channel (221) by two substantially semi-annular refrigerant channels (221) opposed to each other.

In a third aspect of the present invention, the refrigerant container (2) is formed by arranging an intermediate plate member (22), in which slits (221, 222) that serve as refrigerant channels and penetrate through the intermediate plate member (22) in the direction of the plate member's thickness are formed, between two external plate members (21, 24) so as to form a multilayer structure, and the substantially annular refrigerant channel (221) and the substantially straight refrigerant channels (222) are formed as slits in the intermediate plate member (22) arranged nearest the bottom of the refrigerant container (2).

According to the third aspect, it is easy to construct the refrigerant container (2) by stacking the intermediate plate member (22) in which the slits that serve as the refrigerant channels are formed, together with the external plate members (21, 24). Moreover, as the refrigerant channel that surrounds the boiling area (61) is substantially annular, it is possible to form the intermediate plate member (22) so as to connect the inside parts and outside parts of the refrigerant channel (221) that surrounds the boiling area (61), even if the refrigerant channel is formed by the slits penetrating through the plate in the direction of its thickness. Therefore, it is easy to handle the intermediate plate member (22) in manufacturing and assembling.

In addition, it is possible to make more secure the connection between the inside parts and outside parts of the refrigerant channel (221) that surrounds the boiling area (61), when the substantially annular refrigerant channel (221) is composed of the two substantially semi-annular refrigerant channels (221) opposed to each other, in the second aspect of the present invention.

In a fourth aspect of the present invention, in a second intermediate plate member (23) arranged adjacently to a first intermediate plate member (22) that is the intermediate plate member (22) arranged nearest the bottom, communication channels (232), through which ends (221a) of the substantially annular refrigerant channel (221) are communicated with each other, are formed.

According to the fourth aspect, it is possible to form an annular refrigerant channel by the substantially annular refrigerant channel (221) in the first intermediate plate member (22) and the communication channels (232) in the second intermediate plate member (23). Therefore, it is possible to prevent poor circulation of the refrigerant without fail.

In a fifth aspect of the present invention, the substantially annular refrigerant channel (221) and the substantially straight refrigerant channels (222) have a symmetrical shape with respect to the boiling area (61).

According to the fifth aspect, even if the cooling apparatus boiling and condensing refrigerant (1) is tilted in any direction, it is possible to supply the refrigerant to the boiling area (61) through the substantially annular refrigerant channel (221) and the substantially straight refrigerant channels (222).

In a sixth aspect of the present invention, a cooling apparatus boiling and condensing refrigerant (1) comprises a refrigerant container (2) to the bottom outside of which a heat-generating member (6) is attached and within which a refrigerant that boils when it receives heat from the heat-generating member (6) is stored, a heat radiating section (3, 5) having plural tubes (3) communicating the inside of the refrigerant container (2) and assembled almost erectly on the surface of the refrigerant container (2), and a header tank (4) through which the plural tubes (3) are communicated with each other; wherein the heat-generating member (6) is cooled by the refrigerant stored in the refrigerant container (2), which is evaporated into vapor when receiving heat from the heat-generating member (6) and radiates the latent heat of the refrigerant vapor from the heat radiating section (3, 5); wherein the boiling area (61) where the refrigerant is evaporated into vapor by the heat-generating member (6) is formed within the refrigerant container (2); and wherein on the floor within the refrigerant container (2), an annular refrigerant channel (221, 421) surrounding the boiling area (61) and the plural substantially straight refrigerant channels (222) extending from the annular refrigerant channel (221, 421) to the boiling area (61), over substantially all around the circumference of the annular refrigerant channel (221, 421), are formed in the same plane.

According to the sixth aspect, even if the cooling apparatus boiling and condensing refrigerant (1) is used in a tilted position, the liquid refrigerant that has condensed completely is supplied to the boiling area (61) through the substantially straight refrigerant channels (222) on the floor within the refrigerant container (2), after being stored at the lowest part through the annular refrigerant channel (221, 421) on the floor within the refrigerant container (2). Therefore, it is unlikely that the movement of the liquid refrigerant is hampered, and it is possible to prevent poor circulation of the refrigerant.

In a seventh aspect of the present invention, the refrigerant container (2) is formed by arranging an intermediate plate member (42), in which slits (221) that serve as refrigerant channels and penetrate through the intermediate plate member (42) in the direction of the plate member's thickness and ditches (421) that have a floor in the direction of the plate member's thickness are formed, between the two external plate members (21, 24) so as to form a multilayer structure, the annular refrigerant channel (221, 421) and the substantially straight refrigerant channels (222) are formed in the intermediate plate member (42) arranged nearest the bottom of the refrigerant container (2), and the annular refrigerant channel (221, 421) is formed by the slits (221) and the ditches (421).

According to the seventh aspect, it is easy to construct the refrigerant container (2) by stacking the intermediate plate member (42) in which the slits (221) and the ditches (421) that serve as the refrigerant channels are formed, together with the external plate members (21, 24). Moreover, as the refrigerant channel (221, 421) that surrounds the boiling area (61) is formed by the slits (221) and the ditches (421), it is possible to form the intermediate plate member (42) so as to connect the inside parts and outside parts of the refrigerant channel (221, 421) that surrounds the boiling area (61) through the section where the ditches (421) are formed. Therefore, it is easy to handle the intermediate plate member (42) in manufacturing and assembling.

In an eighth aspect of the present invention, the refrigerant container (2) is formed by arranging plural plate members (51, 23, 24) so as to form a multilayer structure and an annular refrigerant channel (521) and substantially straight refrigerant channels (522) are formed in a plate member (51) arranged nearest the bottom of the refrigerant container (2) and are ditches that have a floor.

According to the eighth aspect, it is easy to construct the refrigerant container (2) by stacking the plate member (51), in which the annular refrigerant channel (521) and the substantially straight refrigerant channels (522) are formed, together with other plate members.

In a ninth aspect of the present invention, the annular refrigerant channel (221, 421) and the substantially straight refrigerant channels (222) have a symmetrical shape with respect to the boiling area (61).

According to the ninth aspect, even if the cooling apparatus boiling and condensing refrigerant (1) is tilted in any direction, it is possible to supply the refrigerant to the boiling area (61) through the annular refrigerant channel (221, 421) and the substantially straight refrigerant channels (222).

In a tenth aspect of the present invention, heat radiating fins (5) are formed between the plural tubes (3).

According to the tenth aspect, it is possible to improve the heat radiation performance of the heat radiating sections (3, 5).

The symbols in the brackets attached to each means described above show the relationship of correspondence with the concrete means described in the embodiments that will be described later.

The present invention may be more fully understood from the description of the preferred embodiments of the invention set forth below, together with the accompanying drawings.

DESCRIPTION OF THE PREFERRED EMBODIMENTS

Preferred embodiments of the present invention are described below with reference to drawings.

[First embodiment]

Figure 1:
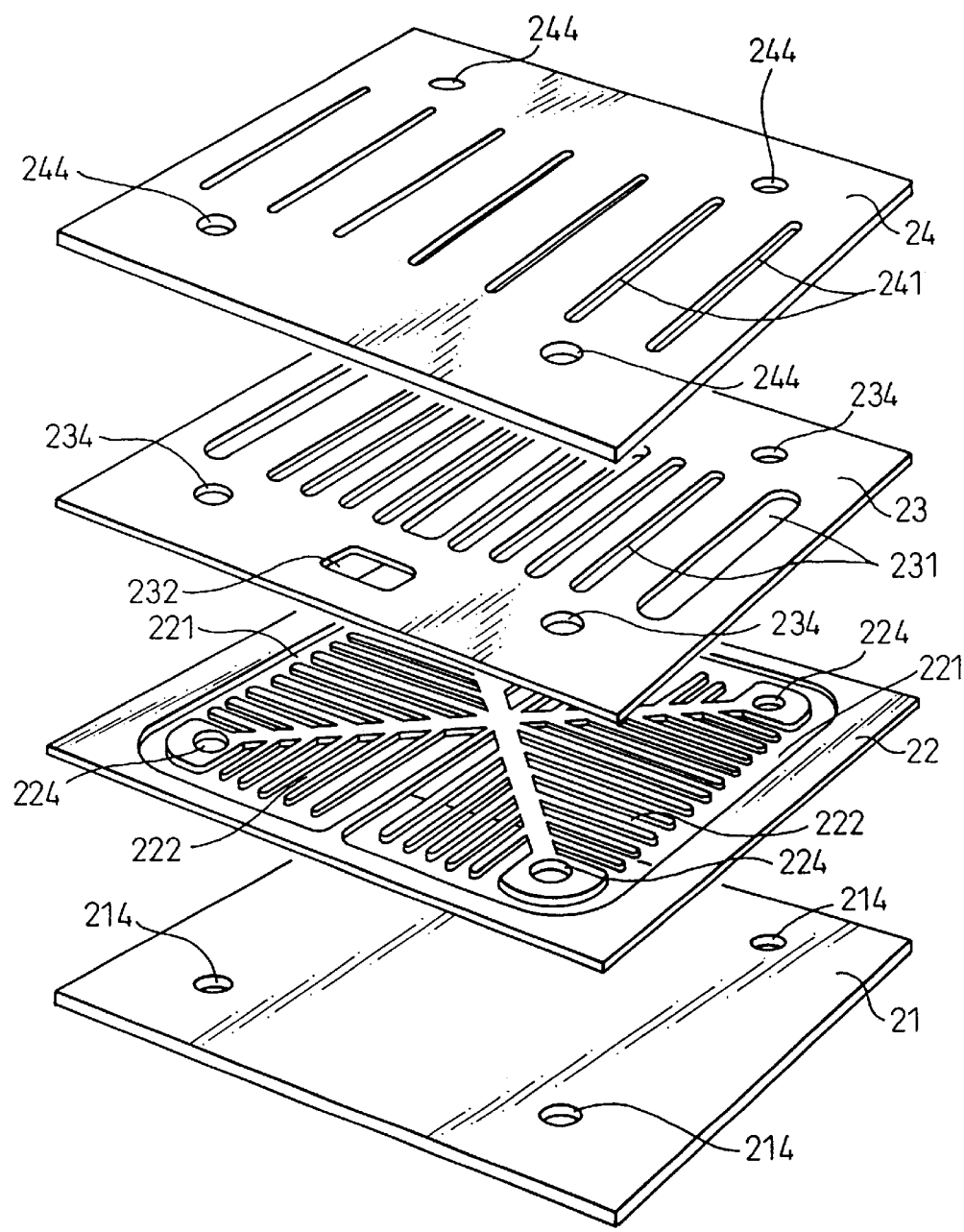
FIG. 1 is a perspective illustration that shows a multilayer structure of a refrigerant container in a first embodiment of the present invention.
Figure 2:
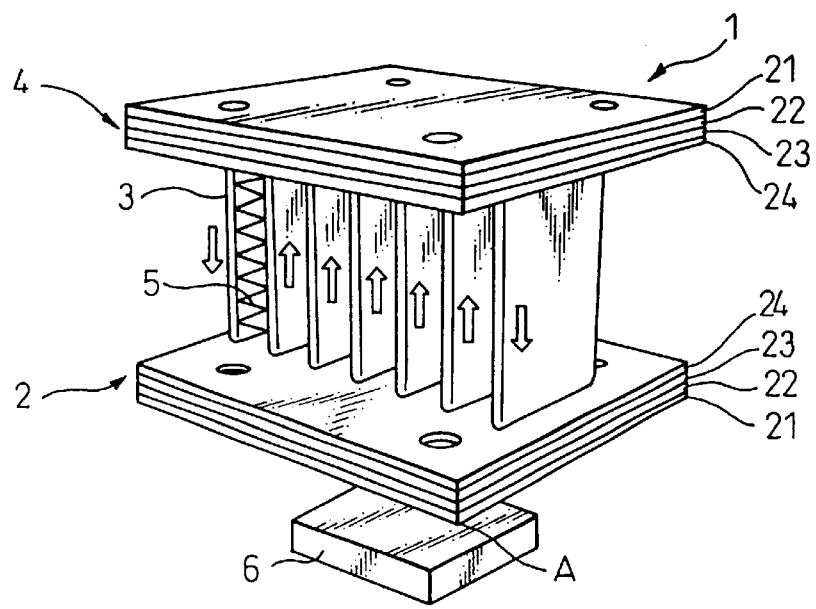
FIG. 2 is an external perspective view of a cooling apparatus boiling and condensing refrigerant in the first embodiment of the present invention.

FIG. 1 is a perspective illustration that shows a multilayer structure of a refrigerant container in a first embodiment of the present invention. FIG. 2 is an external perspective view of a cooling apparatus boiling and condensing refrigerant.

As shown in FIG. 2, a cooling apparatus boiling and condensing refrigerant 1 is used to cool, for example, a heat-generating member 6 such as a semiconductor device, comprising a refrigerant container 2 that stores a refrigerant in its internal space, plural tubes (seven tubes in this embodiment) that communicate the internal space in the refrigerant container 2, a header tank 4 through which the plural tubes 3 are communicated with each other, and heat radiating fins 5 provided between the plural tubes 3.

In FIG. 2, the heat radiating fin 5 between only a pair of tubes 3 is shown schematically and other five between the tubes 3 are not shown. Although the heat-generating member 6 should be installed in the center of the bottom outside of the refrigerant container 2, it is shifted downward in FIG. 2 in order to show it clearly in the drawing. In the following description, the boiling area is defined by the area, inside the refrigerant container 2, on which the heat-generating member attaching area to the refrigerant container 2 is projected from the bottom to the upper side and the refrigerant is evaporated into vapor in this boiling area when it receives heat from the heat-generating member 6.

As shown in FIG. 1 and FIG. 2, the refrigerant container 2 comprises a heat receiving plate 21, which is an external plate member near the bottom side, a heat radiating plate 24, which is an external plate member near the upper side, an intermediate plate 22, which is a first intermediate plate member, and an intermediate plate 23, which is a second intermediate plate member, both intermediate plates 22 and 23 being stacked between the heat receiving plate 21 and the heat radiating plate 24. Moreover, as shown in FIG. 2, the header tank 4 comprises the four plates 21 to 24, which compose the refrigerant container 2, stacked in the reverse order of that of the refrigerant container 2 from the bottom to the top.

The heat receiving plate 21, the heat radiating plate 24 and the intermediate plates 22 and 23 can be brazed and are made of metal plates (for example, an aluminum plate or aluminum alloy plate) that have an excellent heat conductivity, being formed into a rectangular shape whose planar shape is identical. In concrete terms, the heat receiving plate 21 is made of an aluminum plate that has an excellent heat conductivity and the other plates 22 to 24 are made of clad metals that are aluminum base alloy plates, on the surface of which a layer of brazing filler metal is formed.

As shown in FIG. 1, in the heat radiating plate 24, plural slit-shaped openings 241 are formed. These openings 241 are insertion holes into which the tubes 3 are inserted, as will be described later. Through holes 214, 224, 234 and 244 are provided in each of the plates 21 to 24 at plural parts (four parts in this embodiment), and these holes are aligned in series when the plates are stacked on each other. These through holes 214, 224, 234 and 244 are used to screw the cooling apparatus boiling and condensing refrigerant 1 to electronic equipment or the like (not shown) that is provided with the heat-generating member 6. The slits, etc., which are used as refrigerant channels formed in the intermediate plates 22 and 23 will be described later.

The tube 3 shown in FIG. 2 is a flat porous tube having plural internal tube-like channels manufactured by extruding an aluminum material. The heat radiating fin 5 is manufactured by forming a thin aluminum plate having an excellent heat conductivity into a corrugated shape. The thin plate used to form the heat radiating fin 5 has a layer of brazing filler metal on the surface thereof. The cooling apparatus boiling and condensing refrigerant 1 is formed by integrally brazing each of the plates 21 to 24, which compose the refrigerant container 2 and the header tank 4, the tubes 3 and the heat radiating fins 5.

Figure 3:
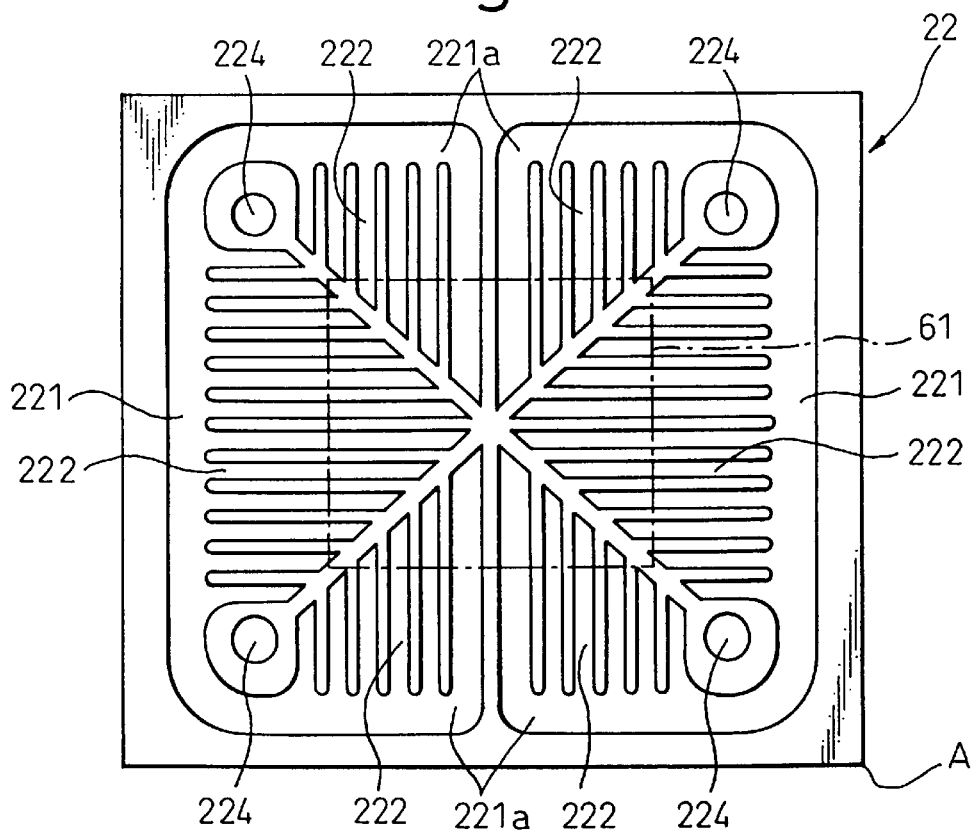
FIG. 3 is a top plan view of an intermediate plate 22 in FIG. 1 and FIG. 2.

FIG. 3 is a top plan view of the intermediate plate 22. The area surrounded by the alternating long and short dashed line is the boiling area 61 mentioned above. In the intermediate plate 22, as shown in FIG. 3, two peripheral channels 221, which are substantially semi-annular refrigerant channels having a reversed C-shape, are formed so as to be opposed to each other and surround the boiling area 61. The peripheral channels 221 are the substantially annular refrigerant channels in the present embodiment.

In the inner area of the reversed C-shaped peripheral channel 221, plural straight channels 222 that extend from the peripheral channel 221 to the boiling area 61 are formed. The straight channels 222 are formed substantially all around the circumference of the peripheral channel 221. In other words, the two peripheral channels 221 are formed so as to surround the boiling area 61 and, at the same time, the straight channels 222, which are the substantially straight refrigerant channels, are formed substantially all around the circumference of the peripheral channel 221.

Both the peripheral channels 221 and the straight channels 222 are formed together with the above-mentioned through holes 224 as slits and by press working. Although press working is employed to form the slits in the present embodiment, it is also possible to employ cutting working, etching working, etc.

On the other hand, slit-shaped openings 231 are formed in the intermediate plate 23, as shown in FIG. 1. These openings make up a structure in which the inside of the refrigerant container 2 and the tubes 3 are communicated with each other. Moreover, in the intermediate plate 23, two openings 232 (only one of them is shown in FIG. 1) are formed at the area where ends 221a of the peripheral channels 221 in the intermediate plate 22 shown in FIG. 3 can be communicated with each other. The openings 232 are the communication channels in the present embodiment.

The openings 231 and the openings 232 are formed together with the above-mentioned through holes 234 by a press working. Although a press working is employed to form the openings in the present embodiment, it is also possible to employ a cutting working, etching working, etc.

Although not shown schematically, the refrigerant container 2 is provided with a filler pipe that communicates the internal space within the refrigerant container 2 and the top end of the filler pipe is cut and sealed off after a fixed amount of refrigerant has been filled into the internal space through the filler pipe. As a refrigerant, a chlorofluorocarbon is used in the present embodiment.

Next, the operations of the cooling apparatus boiling and condensing refrigerant 1 having the above-mentioned structure are described below.

The refrigerant stored in the refrigerant container 2 is evaporated into vapor mainly in the boiling area 61 when it receives heat from the heat-generating member 6, and the gaseous refrigerant flows into the inside of the tubes 3 (the five tubes 3 in the center shown in FIG. 1) from the refrigerant container 2. The refrigerant that has flowed into the tubes 3 from the refrigerant container 2 passes through the inside of the header tank 4 and returns to the inside of the refrigerant container 2 through the two tubes 3 in both outsides.

While it flows through the inside of the tubes 3, the refrigerant is cooled by the heat exchange with the outside air and the resultant condensate circulates to the refrigerant container 2. By repeating the above-mentioned cycle (boiling-condensation/liquefaction), the heat-generating member 6 is cooled down. As the heat radiating fins 5 are arranged between the tubes 3, the refrigerant can be condensed efficiently. The structure consisting of the tubes 3 and the heat radiating fins 5 is the heat radiating section in the present embodiment.

The liquid refrigerant returning from the tubes 3 to the refrigerant container 2 flows into the peripheral channels 221 in the intermediate plate 22 through the openings 231 provided at the outermost area of the intermediate plate 23. The liquid refrigerant that has flowed into the peripheral channels 221 is supplied to the boiling area 61 through the straight channels 222. In this way, the refrigerant circulates through the cooling apparatus boiling and condensing refrigerant 1.

The flowing state of the refrigerant within the refrigerant container 2 when the cooling apparatus boiling and condensing refrigerant 1 is placed in a tilted position so that the corner A of the refrigerant container 2 shown in FIG. 2 is in the lowest position will be described below.

The liquid refrigerant that has flowed into the refrigerant container 2 through the tubes 3 arranged at the outermost positions as shown in FIG. 2 flows into the right and left peripheral channels 221 in the intermediate plate 22 shown in FIG. 3 through the openings 231 provided at the outermost positions of the intermediate plate 23 shown in FIG. 1. As the refrigerant container 2 is tilted in such a state that the corner A is in a lower position, the liquid refrigerant that has flowed into the right peripheral channel 221 in the figure is stored near the corner A.

On the other hand, the liquid refrigerant that has flowed into the left peripheral channel 221 in the figure flows from the left peripheral channel 221 in the figure into the right peripheral channel 221 in the figure through the openings 232 (shown in FIG. 1) in the intermediate plate 23 with which the ends 221a of the right and left peripheral channels 221 are communicated with each other, and is stored near the corner A. The liquid refrigerant that has not flowed into the right peripheral channel 221 in the figure is stored near the corner A within the left peripheral channel 221 in the figure.

The liquid refrigerant that has been thus stored near the corner A, within the peripheral channel 221, which is in the lowest position, is supplied to the boiling area 61 through the straight channels 222 extending toward the boiling area 61 from the right side in FIG. 3 and through those 232 extending toward the boiling area 61 from the bottom side in FIG.

3, as the liquid refrigerant is evaporated into vapor, in the boiling area 61, due to heat generated by the above-mentioned heat-generating member 6 and flows toward the tubes 3.

In cases where the cooling apparatus boiling and condensing refrigerant 1 is placed while tilted in another direction, the condensed liquid refrigerant that has flowed into the refrigerant container 2 is stored near the lowest part within the peripheral channel 221 and supplied to the boiling area 61 through the straight channels 222 extending toward the boiling area 61 from the lowest part. In other words, the cooling apparatus boiling and condensing refrigerant 1 in this embodiment can supply the condensed liquid refrigerant to the boiling area 61 through the straight channels 222 from the peripheral channels 221, even if it is placed in a state tilted in any direction.

According to the above-mentioned structure and operations, even if the cooling apparatus boiling and condensing refrigerant 1 is placed in a tilted position, poor circulation of the refrigerant can be prevented due to the peripheral channels 221 and the straight channels 222 formed in the same plane, which are unlikely to block the movement of the liquid refrigerant.

As the refrigerant container 2 and the header tank 4 are constructed by the four plates 21 to 24, manufacturing is easy. Moreover, as the peripheral channels 221 in the intermediate plate 22 are formed by the two reversed C-shaped slits, the intermediate plate 22 is not divided into an outside section and inside section by the peripheral channels 221, resulting in easier manufacturing.

The peripheral channels 221 are formed as the two reversed C-shaped slits, but the ends 221a thereof are communicated with each other through the openings 232 in the intermediate plate 23, therefore, it is possible to send the liquid refrigerant without fail from the peripheral channel 221 located on the upper side to that on the lower side, although the flow resistance of the refrigerant is not lower than that in the case where the two slits are communicated with each other in the same plane.

[Second embodiment]

Next, a second embodiment will be described below with reference to FIG. 4. The difference between the second embodiment and the above-mentioned first embodiment is the structure of the first intermediate plate member. The same symbols are used for the same parts as the first embodiment and their description will not be given here.

Figure 4:
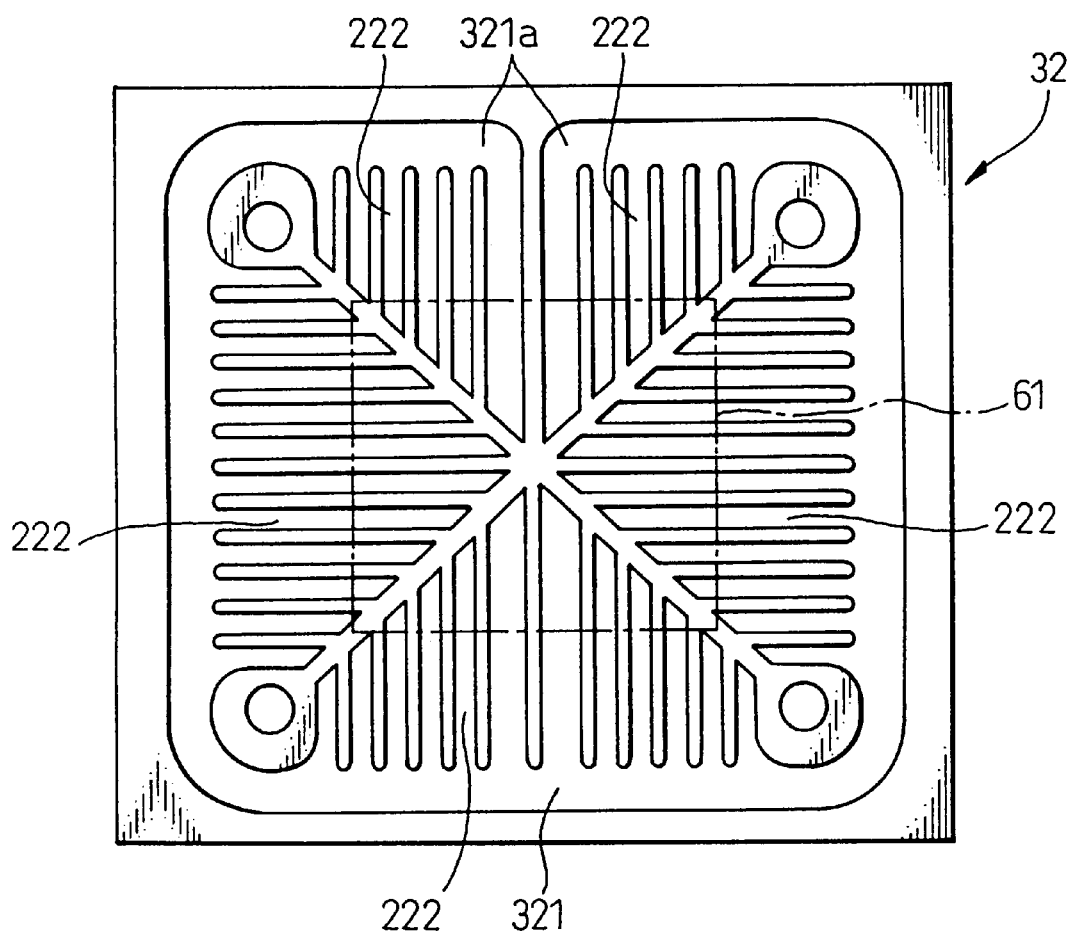
FIG. 4 is a top plan view of an intermediate plate 32 in a second embodiment of the present invention.

FIG. 4 is a top plan view of an intermediate plate 32, which is the first intermediate plate member. As shown in FIG. 4, the intermediate plate 32 comprises a C-shaped peripheral channel 321 that surrounds the boiling area 61. This peripheral channel 321 is the substantially annular refrigerant channel in the present embodiment. In addition, the straight channels 222 that extend from the peripheral channel 321 to the boiling area 61, over substantially all around the circumference of the peripheral channel 321, are formed. The refrigerant container 2 and the header tank 4 are composed of the plates 21, 32, 23 and 24.

In this way, as in the first embodiment, even if the cooling apparatus boiling and condensing refrigerant 1 is placed in a tilted position, poor circulation of the refrigerant can be prevented due to the peripheral channel 321 and the straight channels 222 both provided in the same plane, which are unlikely to block the movement of the liquid refrigerant.

As the refrigerant container 2 and the header tank 4 are constructed by the four plates 21, 32, 23 and 24, manufacturing is easy. Moreover, as the peripheral channel 321 in the intermediate plate 32 is formed by a single C-shaped slit, the intermediate plate 32 is not divided into an outside section and inside section by the peripheral channel 321. The peripheral channel 321 is formed as the single C-shaped slit, but the ends 321a thereof are communicated with each other through the opening 232 in the intermediate plate 23, similar to the first embodiment, therefore, it is possible to send the liquid refrigerant without fail from the end 321a located on the upper side to that on the lower side, although the flow resistance of the refrigerant is not lower than that in the case where the two ends are communicated with each other in the same plane.

[Third embodiment]

Next, a third embodiment will be described below with reference to FIG. 5. The difference between the third embodiment and the first embodiment is also the structure of the first intermediate plate member. The same symbols are used for the same parts as the first embodiment and their description will not be given here.

Figure 5:
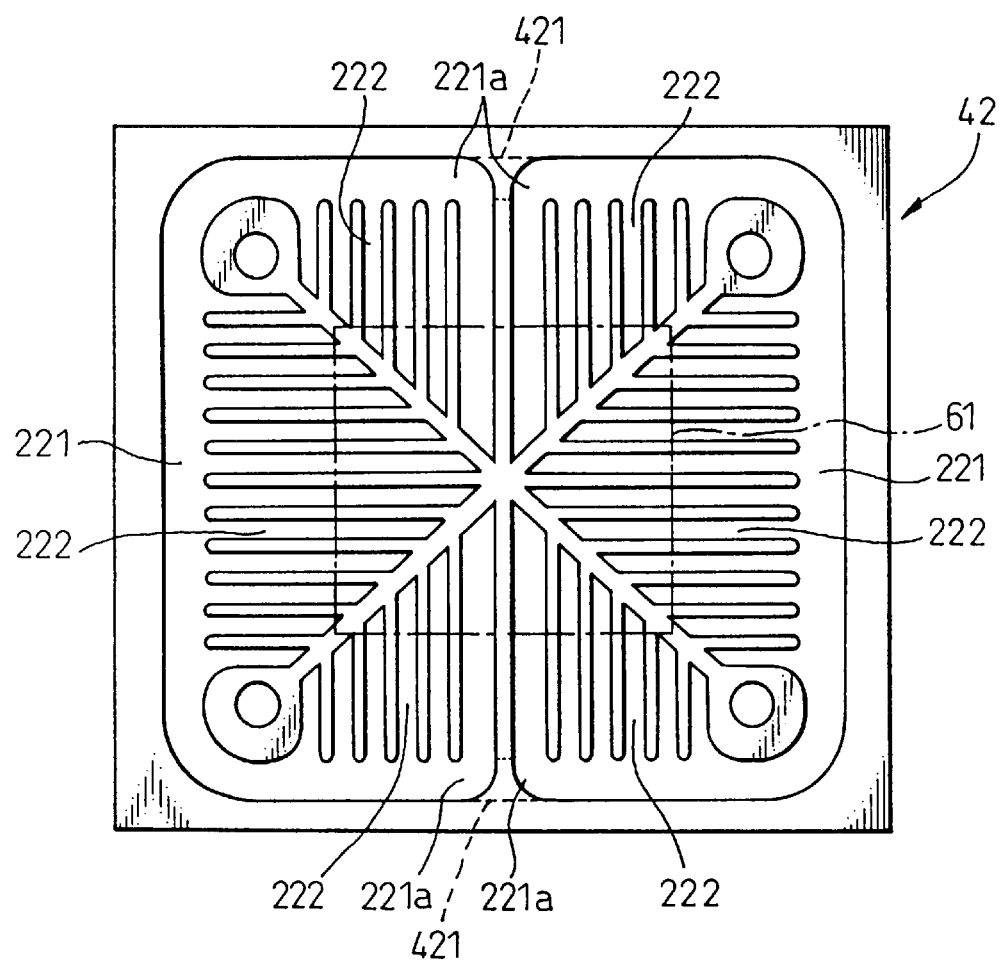
FIG. 5 is a top plan view of an intermediate plate 42 in a third embodiment of the present invention.

FIG. 5 is a top plan view of an intermediate plate 42, which is the first intermediate plate member. As shown in FIG. 5, the intermediate plate 42 comprises the two reversed C-shaped peripheral channels 221 that surround the boiling area 61, as similar to the intermediate plate 22 in the first embodiment. In addition, communication ditches 421 the depth of which is about half the thickness of the plate are provided between the neighboring ends 221a of the peripheral channels 221, and the two peripheral channels 221 can be communicated with each other through these communication ditches 421 when the plates 21, 42, 23 and 24 are stacked on each other to form the refrigerant container.

Therefore, the opening 232 is not necessary in the intermediate plate 23 in the present embodiment. The annular refrigerant channel in the present embodiment is composed of the two peripheral channels 221, which are the slits that penetrate through the plate, and the two communication ditches 421, which are ditches that do not penetrate through the plate. In addition, there are provided the straight channels 222 extending from the peripheral channels 221 to the boiling area 61 over substantially all around the circumference of the peripheral channels 221. The refrigerant container 2 and the header tank 4 are composed of the plates 21, 42, 23 and 24.

In this way, as is in the first embodiment, even if the cooling apparatus boiling and condensing refrigerant 1 is placed in a tilted position, poor circulation of the refrigerant can be prevented due to the peripheral channels 221, the communication ditches 421 and the straight channels 222 all provided in the same plane, which are unlikely to block the movement of the liquid refrigerant.

As the refrigerant container 2 and the header tank 4 are constructed by the four plates 21, 42, 23 and 24, manufacturing is easy. Moreover, as the annular refrigerant channel in the intermediate plate 32 is formed by the two peripheral channels 221, which are the reversed C-shaped slits, and the communication ditches 421 through which the two peripheral channels 221 are communicated with each other, the intermediate plate 42 is not divided into an outside section and inside section by the annular refrigerant channel. As the annular refrigerant channel is formed in the same plane, the liquid refrigerant can be sent without fail to the lower side within the annular refrigerant channel.

[Fourth embodiment]

Next, a fourth embodiment will be described below with reference to FIG. 6. The fourth embodiment differs from the above-mentioned first embodiment in that the first intermediate plate is not used and the structure of the heat receiving plate, which is the plate member arranged in the lowest position, is different. The same symbols are used for the same parts as the first embodiment and their description will not be given here.

Figure 6:
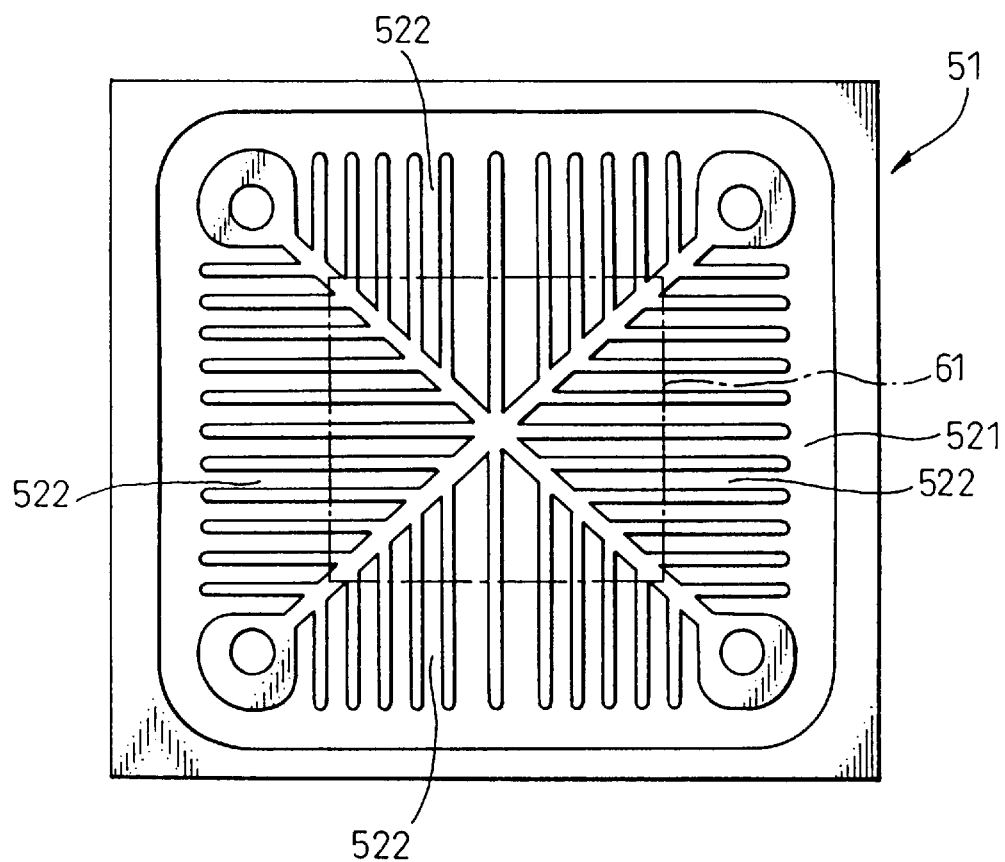
FIG. 6 is a top plan view of a heat receiving plate 51 in a fourth embodiment of the present invention.

FIG. 6 is a top plan view of a heat receiving plate 51, which is the plate member. As shown in FIG. 6, the heat receiving plate 51 comprises an annular ditch 521 that does not penetrate through the plate and surrounds the boiling area 61. This annular ditch 521 is the annular refrigerant channel in the present embodiment. In addition, there are provided straight ditches 522 that do not penetrate through the plate and extend from the annular ditch 521 to the boiling area 61 over substantially all around the circumference of the annular ditch 521. These straight ditches 522 are the substantially straight refrigerant channels in the present embodiment.

In the present embodiment, the intermediate plate 22 is not used and the refrigerant container 2 and the header tank 4 are composed of the plates 51, 23 and 24. Moreover, the opening 232 is not provided in the intermediate plate 23.

In this way, as in the first embodiment, even if the cooling apparatus boiling and condensing refrigerant 1 is placed in a tilted position, poor circulation of the refrigerant can be prevented due to the annular ditch 521 and the straight ditches 522 both provided in the same plane, which are unlikely to block the movement of the liquid refrigerant.

As the refrigerant container 2 and the header tank 4 are constructed by the three plates 51, 23 and 24, manufacturing is easy. Moreover, as the annular refrigerant channel in the heat receiving plate 51 is formed by the annular ditch 521, the heat receiving plate 51 is not divided by the annular refrigerant channel. Still moreover, as the annular refrigerant channel is formed in the same plane, the liquid refrigerant can be sent without fail to the lower side within the annular refrigerant channel.

Although the annular ditch 521 and the straight ditches 522 are formed in the heat receiving plate 51 in the present embodiment, it is also possible to use the heat receiving plate 21, as in the first embodiment and, at the same time, to form two members, as the first intermediate plate members, that sandwich the annular refrigerant channel, so that when the heat receiving plate 21 and the two members are bonded together they are stacked to form the same structure as the heat receiving plate 51 in the present embodiment.

[Other Embodiments]

Figure 7:
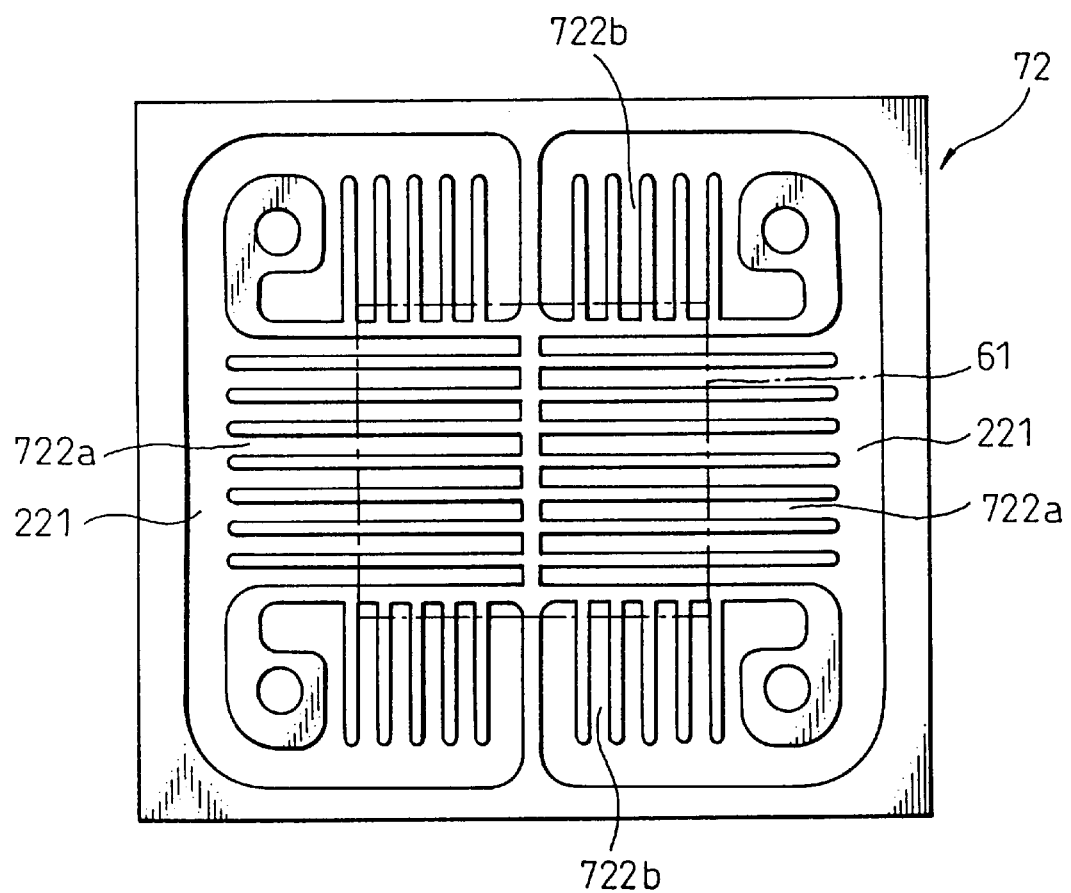
FIG. 7 is a top plan view of an intermediate plate 72 in other embodiments of the present invention.

Although channels of different length are provided in parallel, as the substantially straight refrigerant channels, in each of the above-mentioned embodiments, they are not limited to these channels as long as they extend from the annular refrigerant channel or the substantially annular refrigerant channel to the boiling area. For example, as shown in FIG. 7, an intermediate plate 72, which is the first intermediate plate, which is provided with two kinds of straight line channels 772a and 772b of different length which extend from the peripheral channel 221 to the boiling area 61 over substantially all around the circumference of the peripheral channel 221 may be used.

Figure 8A:
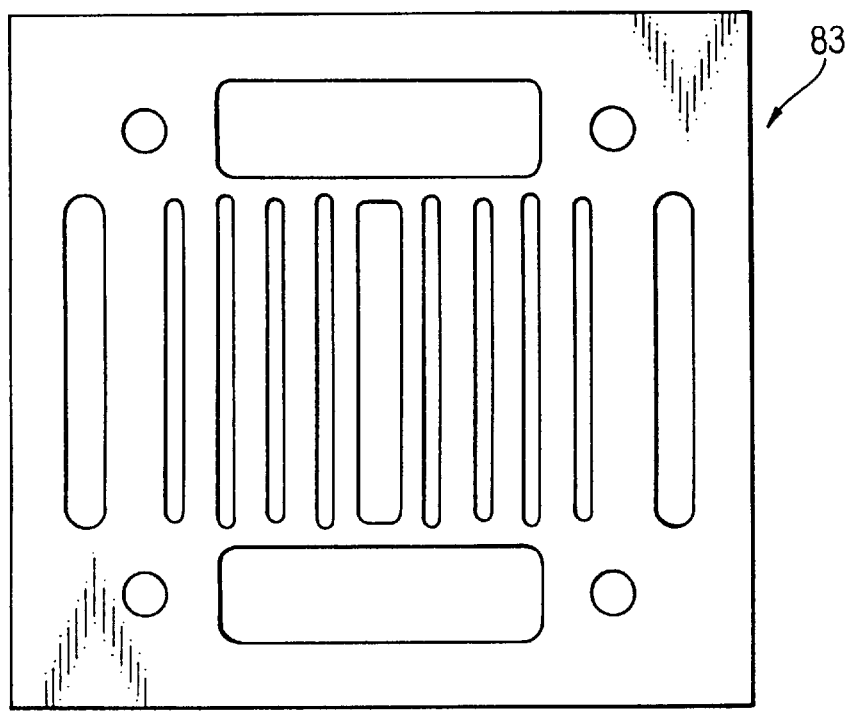
FIG. 8A is a top plan view of an intermediate plate 83 in the other embodiments of the present invention.
Figure 8B:
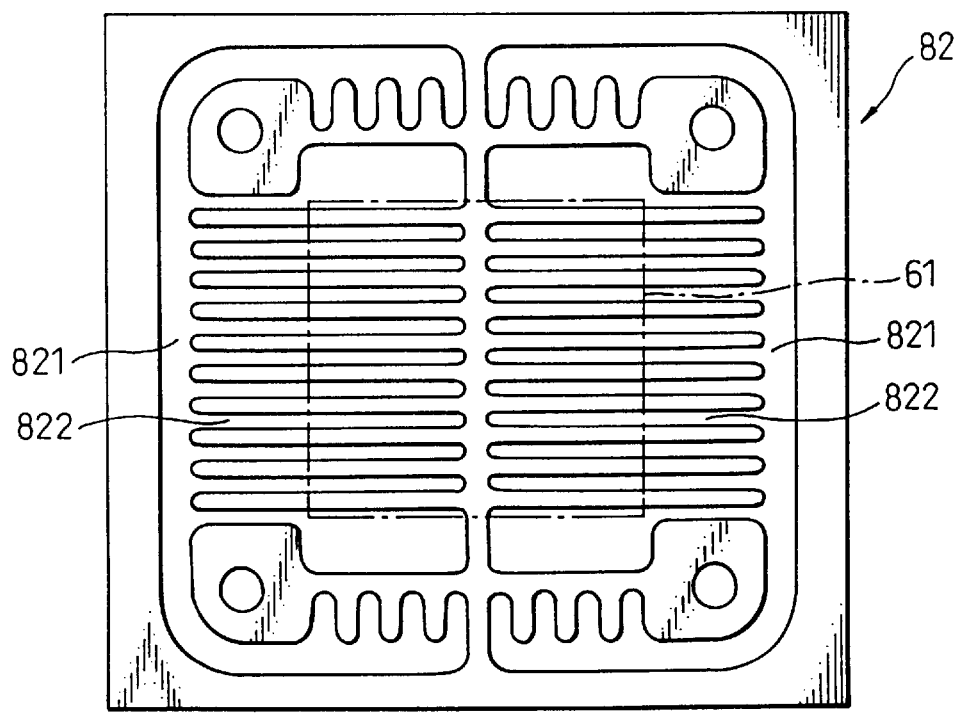
FIG. 8B is a top plan view of an intermediate plate 82 in the other embodiments of the present invention.
Figure 9A:
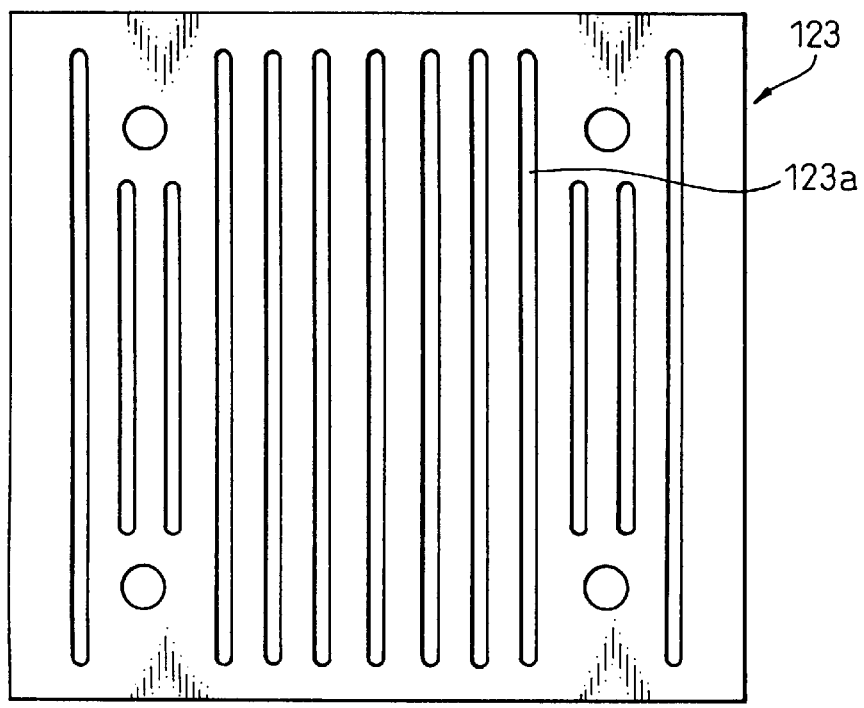
FIG. 9A is a top plan view of an intermediate plate in conventional cooling apparatuses boiling and condensing refrigerant.
Figure 9B:
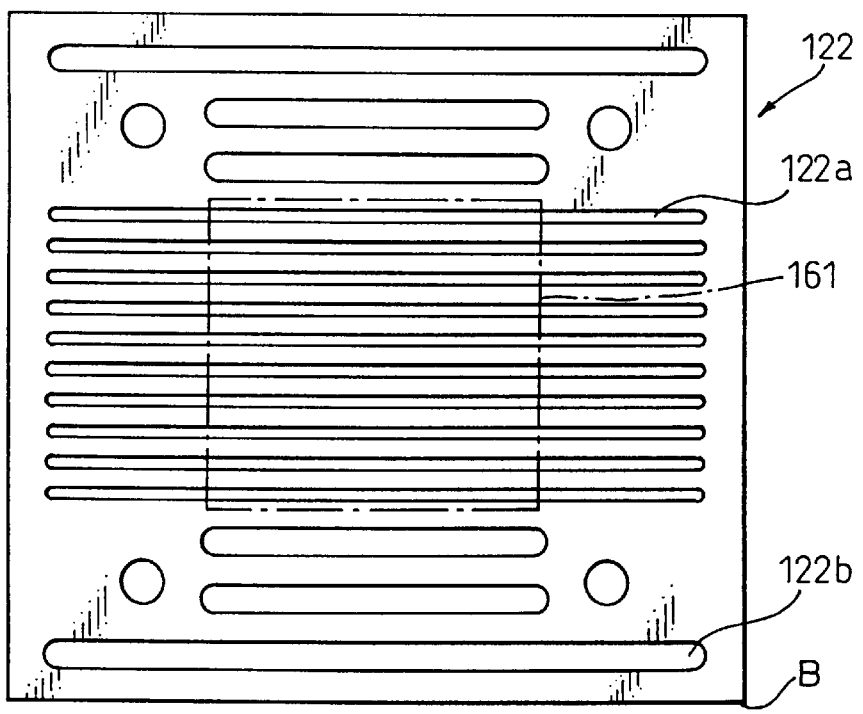
FIG. 9B is a top plan view of an intermediate plate in conventional cooling apparatuses boiling and condensing refrigerant.

Moreover, for example, an intermediate plate 82, which is the first intermediate plate member having peripheral channels 821 and straight channels 822 as shown in FIG. 8B, and an intermediate plate 83, which is the second intermediate plate member shown in FIG. 8A, may be stacked together with the heat receiving plate 21 and the heat radiating plate 24, similar to the first embodiment. According to each embodiment mentioned above, it is easy to manufacture the plates 22, 32, 42, 72, 82 and 83 even if their slits have complex shapes, because the slits thereof are formed by a press working.

Although the straight channels 222 or the straight ditches 522 are formed as the substantially straight refrigerant channels in each embodiment mentioned above, these channels or ditches may bend or meander to a certain extent as long as they do not block the movement of the liquid refrigerant seriously.

Moreover, although the heat radiating fins 5, which are of the so-called the corrugated type, are provided between the tubes 3 in each embodiment mentioned above, other types of fins may be used. If the heat radiating performance can be maintained sufficiently, the fins may be omitted.

While the invention has been described by reference to specific embodiments chosen for the purposes of illustration, it should be apparent that numerous modifications could be made thereto by those skilled in the art without departing from the basic concept and scope of the invention.

What is claimed is:

1. A cooling apparatus boiling and condensing refrigerant comprising:

a refrigerant container to the bottom outside of which a heat-generating member is attached and within which a refrigerant that boils when it receives heat from the heat-generating member is stored, a heat radiating section having plural tubes communicating the inside of the refrigerant container and assembled almost erectly on the surface of the refrigerant container, and a header tank through which the plural tubes are communicated with each other;

wherein the heat-generating member is cooled by the refrigerant stored in the refrigerant container, which is evaporated into vapor when receiving heat from the heat-generating member and radiates the latent heat of the refrigerant vapor from the heat radiating section;

wherein a boiling area where the refrigerant is evaporated into vapor by the heat-generating member is formed within the refrigerant container; and wherein, on the floor within the refrigerant container, one or plural surrounded refrigerant channels surrounding the boiling area and plural substantially straight refrigerant channels extending from the substantially annular refrigerant channels to the boiling area, over substantially all around the circumference of the substantially annular refrigerant channels, are formed in the same plane.

2. A cooling apparatus boiling and condensing refrigerant, as set forth in claim 1, wherein the surrounded refrigerant channel is formed by substantially annular refrigerant channels.

3. A cooling apparatus boiling and condensing refrigerant, as set forth in claim 1, wherein the surrounded refrigerant channel is formed by two substantially semi-annular refrigerant channels opposed to each other.

4. A cooling apparatus boiling and condensing refrigerant, as set forth in claim 1, wherein the refrigerant container is formed by arranging an intermediate plate member, in which slits that serve as refrigerant channels and penetrate through the intermediate plate member in the direction of the plate member's thickness are formed, between two external plate members, so as to form a multilayer structure, and wherein the substantially annular refrigerant channel and the substantially straight refrigerant channels are formed as the slits in the intermediate plate member arranged nearest the bottom of the refrigerant container.

5. A cooling apparatus boiling and condensing refrigerant, as set forth in claim 4, wherein communication channels, through which the ends of the substantially annular refrigerant channel are communicated with each other, are formed in a second intermediate plate member arranged adjacently to a first intermediate plate member, which is the intermediate plate member arranged nearest the bottom.

6. A cooling apparatus boiling and condensing refrigerant, as set forth in claim 1, wherein the substantially annular refrigerant channel and the substantially straight refrigerant channels have a symmetrical shape with respect to the boiling area.

7. A cooling apparatus boiling and condensing refrigerant, as set forth in claim 1, wherein the heat radiating section is provided with heat radiating fins between the plural tubes.

8. A cooling apparatus boiling and condensing refrigerant comprising:

a refrigerant container to the bottom outside of which a heat-generating member is attached and within which a refrigerant that boils when it receives heat from the heat-generating member is stored, a heat radiating section having plural tubes communicating the inside of the refrigerant container and assembled almost erectly on the surface of the refrigerant container, and a header tank through which the plural tubes are communicated with each other;

wherein the heat-generating member is cooled by the refrigerant stored in the refrigerant container, which is evaporated into vapor when receiving heat from the heat-generating member and radiates the latent heat of the refrigerant vapor from the heat radiating section;

wherein a boiling area where the refrigerant is evaporated into vapor by the heat-generating member is formed within the refrigerant container; and wherein on the floor within the refrigerant container, an annular refrigerant channel surrounding the boiling area and plural substantially straight refrigerant channels extending from the annular refrigerant channel to the boiling area, over substantially all around the circumference of the annular refrigerant channel, are formed in the same plane.

9. A cooling apparatus boiling and condensing refrigerant, as set forth in claim 8, wherein the refrigerant container is formed by arranging an intermediate plate member, in which slits that penetrate through the intermediate plate member in the direction of the plate member's thickness and ditches having a floor in the direction of the plate members thickness, both serving as refrigerant channels, are formed, between two external plate members so as to form a multilayer structure, and wherein the annular refrigerant channel and the substantially straight refrigerant channels are formed in the intermediate plate member arranged nearest the bottom of the refrigerant container and the annular refrigerant channel is formed by the slits and the ditches.

10. A cooling apparatus boiling and condensing refrigerant, as set forth in claim 8, wherein the refrigerant container is formed by arranging plural plate members so as to form a multilayer structure, and wherein the annular refrigerant channel and the substantially straight refrigerant channels are formed in the plate member arranged nearest the bottom of the refrigerant container and are ditches that have a floor.

11. A cooling apparatus boiling and condensing refrigerant, as set forth in claim 8, wherein the annular refrigerant channel and the substantially straight refrigerant channels have a symmetric shape with respect to the boiling area.

12. A cooling apparatus boiling and condensing refrigerant, as set forth in claim 7, wherein the heat radiating section is provided with heat radiating fins between the plural tubes.

* * * * *

UNITED STATES PATENT AND TRADEMARK OFFICE
CERTIFICATE OF CORRECTION

PATENT NO. : 6,725,908 B2
DATED : April 27, 2004
INVENTOR(S) : Kazutaka Suzuki

It is certified that error appears in the above-identified patent and that said Letters Patent is hereby corrected as shown below:

<u>Title page,</u>
Item [57], ABSTRACT,
line 2, "plate" should be -- plates --

<u>Column 14,</u>
Line 38, "claim 7" should be -- claim 8 --

Signed and Sealed this

Seventh Day of September, 2004

JON W. DUDAS
*Director of the United States Patent and Trademark Office*